(12) United States Patent
Matamoros

(10) Patent No.: US 10,734,810 B2
(45) Date of Patent: Aug. 4, 2020

(54) COORDINATED FREQUENCY LOAD SHEDDING PROTECTION METHOD USING DISTRIBUTED ELECTRICAL PROTECTION DEVICES

(71) Applicant: S&C Electric Company, Chicago, IL (US)

(72) Inventor: Joseph Matamoros, San Francisco, CA (US)

(73) Assignee: S&C Electric Company, Chicago, IL (US)

(*) Notice: Subject to any disclaimer, the term of this patent is extended or adjusted under 35 U.S.C. 154(b) by 191 days.

(21) Appl. No.: 16/164,401

(22) Filed: Oct. 18, 2018

(65) Prior Publication Data

US 2019/0245347 A1  Aug. 8, 2019

Related U.S. Application Data

(60) Provisional application No. 62/625,990, filed on Feb. 3, 2018.

(51) Int. Cl.
*H02J 3/00* (2006.01)
*H02J 3/14* (2006.01)

(52) U.S. Cl.
CPC ..................... *H02J 3/14* (2013.01)

(58) Field of Classification Search
USPC ......................................... 307/31
See application file for complete search history.

(56) References Cited

U.S. PATENT DOCUMENTS

| 4,370,609 | A | 1/1983 | Wilson et al. |
| 2007/0211401 | A1 | 9/2007 | Mak |
| 2007/0222294 | A1 | 9/2007 | Tsukida |
| 2007/0239372 | A1 | 10/2007 | Schweitzer |
| 2011/0245987 | A1 | 10/2011 | Prtatt |

OTHER PUBLICATIONS

The International Search Report and the Written Opinion for the International Application No. PCT/US2018/066379 dated Mar. 14, 2019. (10 pages).

*Primary Examiner* — Rexford N Barnie
*Assistant Examiner* — Dru Parries

(57) ABSTRACT

A method for providing frequency load shedding in a power distribution network. The network includes a number of distributed switch-gear assemblies that control whether AC power is provided to groups of loads. The distributed switch-gear assemblies monitor the frequency of the AC signal to determine if a frequency event is occurring and also determine the direction of the power flow at the time of the event. The switch-gear assembly may open in an underfrequency event only if the loads are drawing power from the network, and the switch-gear assembly may open in an overfrequency event only if there is reverse power flow during the event. In addition, the order of operation of which switch-gear assemblies may open first in response to the frequency event is determined in advance by the location of the switch-gear assembly in the network and a corresponding time delay and coordinated frequency set-points.

19 Claims, 2 Drawing Sheets

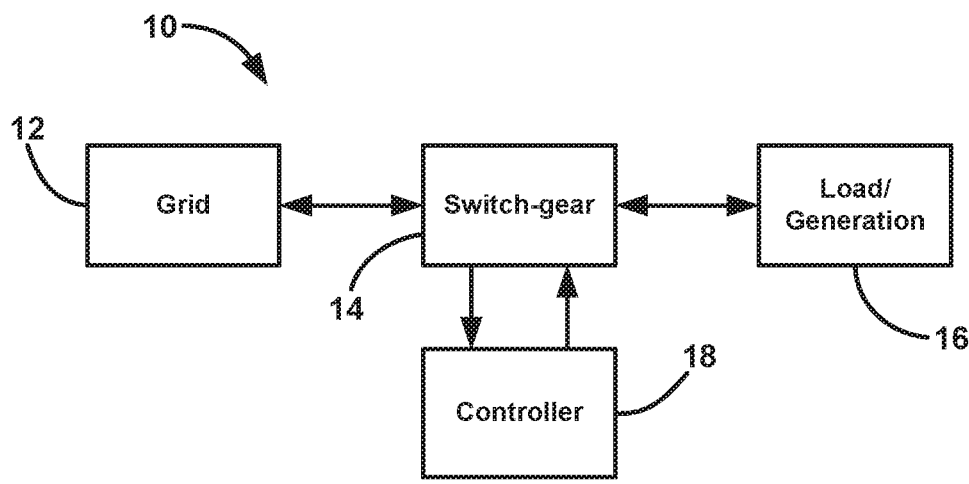
FIGURE 1
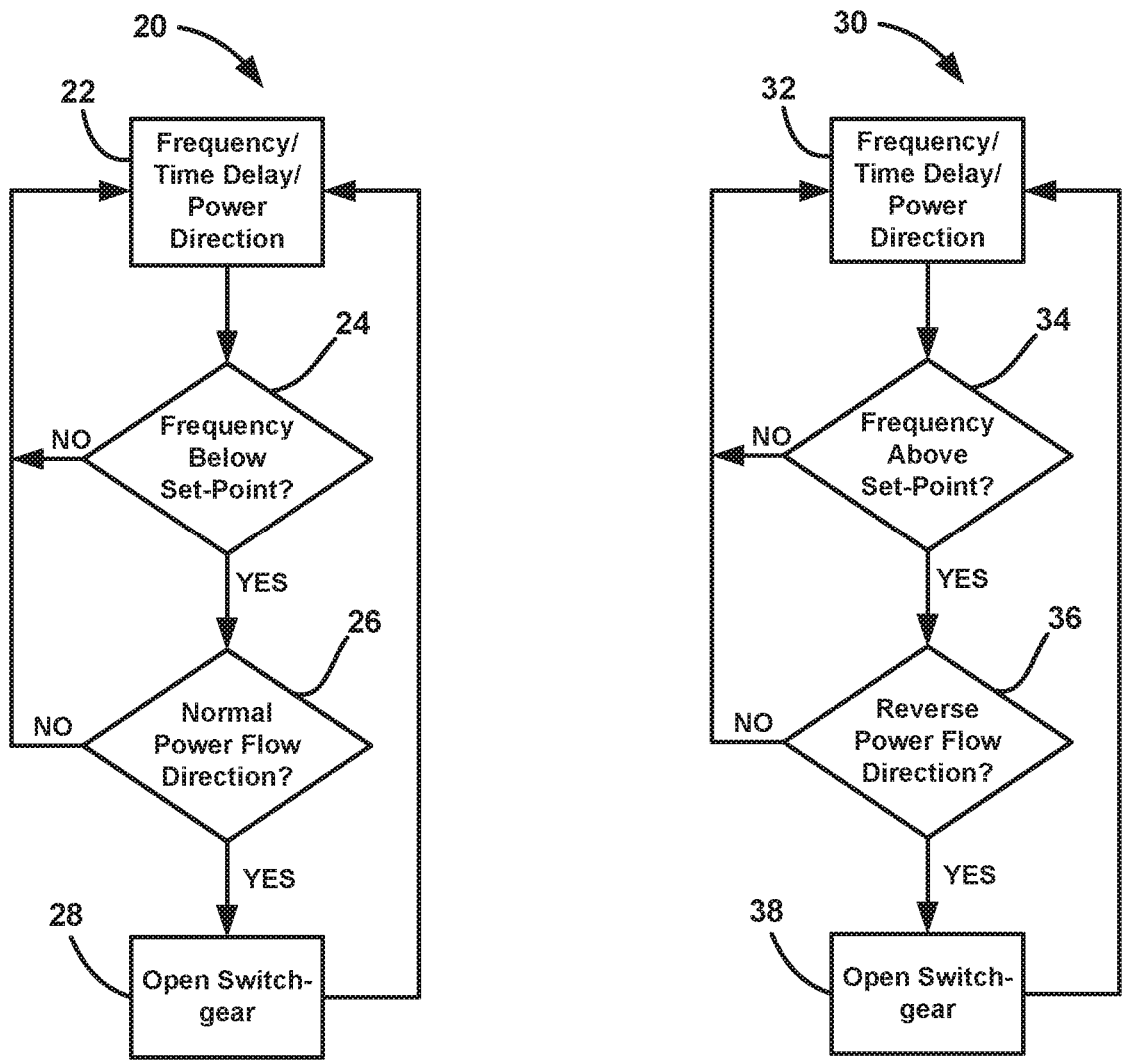
FIGURE 2
FIGURE 3

COORDINATED FREQUENCY LOAD SHEDDING PROTECTION METHOD USING DISTRIBUTED ELECTRICAL PROTECTION DEVICES

CROSS REFERENCE TO RELATED APPLICATION

This application claims the benefit of priority from the U.S. Provisional Application No. 62/625,990, filed on Feb. 3, 2018, the disclosure of which is hereby expressly incorporated herein by reference for all purposes.

BACKGROUND

Field

This disclosure relates generally to a frequency load shedding scheme for disconnecting load in an electrical power distribution network in response to an unusual frequency event and, more particularly, to a frequency load shedding scheme for removing load in an electrical power distribution network in response to a frequency event, where the scheme selectively opens certain switch-gear depending on the direction of the power flow at the switch-gear during the event, and where all of the switch-gear are calibrated and coordinated in advance with a control time-frequency delay so that those switch-gear at an outer edge of the network shed first and that the scheme does not require fast communications during the event.

Discussion of the Related Art

An electrical power distribution network, often referred to as an electrical grid, typically includes a number of power generation plants each having a number of power generators, such as gas or steam turbines powered by thermal energy sources and hydraulic turbines powered by dams. The power plants provide an AC output that enables delivery of electrical power via high voltage transmission to a number of substations, where the voltage is stepped down from high voltage to a medium voltage for distribution. The substations provide the medium voltage electrical service to a number of feeder circuits that are typically delivering power using three phase AC power. The feeder lines are connected to a number of lateral lines that provide the medium voltage to distribution transformers, where the voltage is stepped down to a single or three phase low voltage and is provided to a number of loads, such as homes, businesses, etc. In addition, distributed generation sources may be interconnected with loads in distribution resulting in periods of negative load from time to time.

The high voltage AC provided by the power plant is also a signal in that the AC frequency can be measured at any point in the network and this frequency is controlled at either 50 or 60 Hz. Unlike AC voltage or current measurements, which are driven primarily by local conditions near the point of measurement, the system AC frequency signal can be measured at any point of the voltage step down processes where it is ultimately delivered at that frequency to the load. As the amount of loads and generation varies over time, the frequency of the AC signal provided on the entire electrical grid changes, where, generally the addition of a load causes the frequency to be reduced and the removal of a load causes the frequency to be increased. In order for the electrical power to be generated and delivered to the loads in a stable, reliable and cost effective manner, it is necessary that the frequency of the AC signal be maintained as close as possible to 50 or 60 Hz. Therefore, power generation plants and system operators employ various generation control schemes so that the frequency of the AC signal provided on the grid is maintained at the desired frequency. Generally, rather than shed loads, system operations increase or decrease generation as needed as load is added to and removed from the grid. However, some electrical power distribution networks are limited in their ability to respond quickly enough to an underfrequency event, such as a loss of a major generator or an abrupt increase in loads being applied to the grid. For example, certain power distribution networks, such as island grids, have a limited number of power plants that provide the power, and thus the system has a reduced ability to respond to changes in the frequency of the AC signal as needed. With an increased in uncontrolled distributed generation, the ability to control frequency is reduced further.

For those rare underfrequency transient events when the frequency of the AC signal on the electrical grid decays beyond the ability of the system operator to arrest it with additional generation, the system must immediately reduce the load on the grid within milliseconds so as to avoid potential system failure, referred to in the art as underfrequency load shedding (UFLS). For example, known UFLS schemes typically cause one or more substations in the network to disconnect substation breakers so as to disconnect load. The UFLS schemes impact a relatively large service area in response to a low frequency event due to being deployed at a substation level rather than further down the network closer to loads. Specifically, a controller in pre-selected substations identifies a grid frequency below a certain value, such as 59.6 Hz, and will automatically and autonomously open a breaker within milliseconds to remove the loads that the substation services. The substations are selectively calibrated in advance so that depending on where the substation is located and to who the substation is providing power determines when that substation will remove its loads from the grid. In other words, the various substations are controlled so that they do not all disconnect their loads at the same predetermined low frequency, whereas when a particular substation remove its loads from the grid, the frequency of the AC signal on the grid will go up, which reduces the likelihood that other substations will need to remove their loads from the grid.

With the increase of distributed generation connected at low or medium voltage, sometimes the loads that are disconnected in an underfrequency load shedding scheme may be loads that are actually generating power. More specifically, distributed power generation is becoming more prevalent in electrical power grids where a certain load, such as a home, may actually be generating power through any of a number of power generation techniques, such as solar power, wind power, geo-thermal power, etc., and where at least for certain times, those loads may be injecting power on the grid instead of consuming power from the grid. Thus, since it is unknown in advance what loads may be producing power and at what time, removing those loads from the electrical grid during an underfrequency load shedding event may make an underfrequency transient worse and reduce the ability of the event to be quickly overcome since those loads were acting to support the frequency of the AC signal on the grid. Hence, when an underfrequency condition is detected and load shedding is necessary, the current method of providing underfrequency load shedding via substation-based load shed is not precise in that large areas may be unnecessarily affected and loads generating power may be removed.

Further, there is also less available governor response in smaller grids and grids with a higher proportion of distributed generation to help dampen frequency oscillations that occur during a loss of generation or loss of load events. What is meant by governor response is the ability for generation to increase or decrease power autonomously as needed to counteract frequency transients outside the desired value. Unlike central generation, distributed generation sources typically operate at maximum power and are not either able or not regulated via interconnection tariffs or controlled to provide governor response like central generation.

Moreover, if an underfrequency event occurs, and the underfrequency load shedding process removes large amounts of load to overcome the event, it is possible that removal of the loads could cause the frequency to go above 50 or 60 Hz, which could also cause similar stability control and have wide-area impact as in an underfrequency event.

SUMMARY

Disclosed and described herein are a system and method for providing frequency load shedding in an electrical power distribution network, where the network includes a power source, such as an electrical substation, providing an AC power signal on one or more electrical lines, such as feeder lines and lateral lines, to be distributed to a number of loads electrically coupled to the lateral lines. A number of switch-gear assemblies are provided along the electrical lines to provide electrical control and protection. These assemblies control whether the AC signal is provided to certain groups of the loads depending on where the switch-gear assembly is located in the network. The switch-gear assembly monitors the frequency of the AC signal to detect whether a frequency transient event is occurring, where the frequency of the AC signal falls outside a frequency control deadband. If the control detects that a frequency event is occurring, the switch-gear assembly then determines the direction of the power flow to determine whether the switch-gear assembly should open or remain closed. If the power flow is in the reverse direction indicating that those loads are combining to generate net power, the switch-gear assembly would not open during an underfrequency event. Furthermore, the order of operation of which switch-gear assembly opens first in response to the underfrequency event is determined by the location of the switch-gear assembly and a time delay, where those switch-gear assemblies that are farther from the power source are opened first to limit the number of loads that are affected by the underfrequency event. This scheme does not require any communication during the frequency event. Frequency events occur in milliseconds and require accurate frequency measurements and fast and autonomous switch-gear apparatus to be effective.

Additional features will become apparent from the following description and appended claims, taken in conjunction with the accompanying drawings.

BRIEF DESCRIPTION OF THE DRAWINGS

FIG. 1 is a general block diagram of a power distribution network;

FIG. 2 is a flow chart diagram showing a process for determining whether a switch-gear will be opened in response to an underfrequency event;

FIG. 3 is a flow chart diagram showing a process for determining whether a switch-gear will be opened in response to an overfrequency event.

DETAILED DESCRIPTION OF THE EMBODIMENTS

Figure 4:
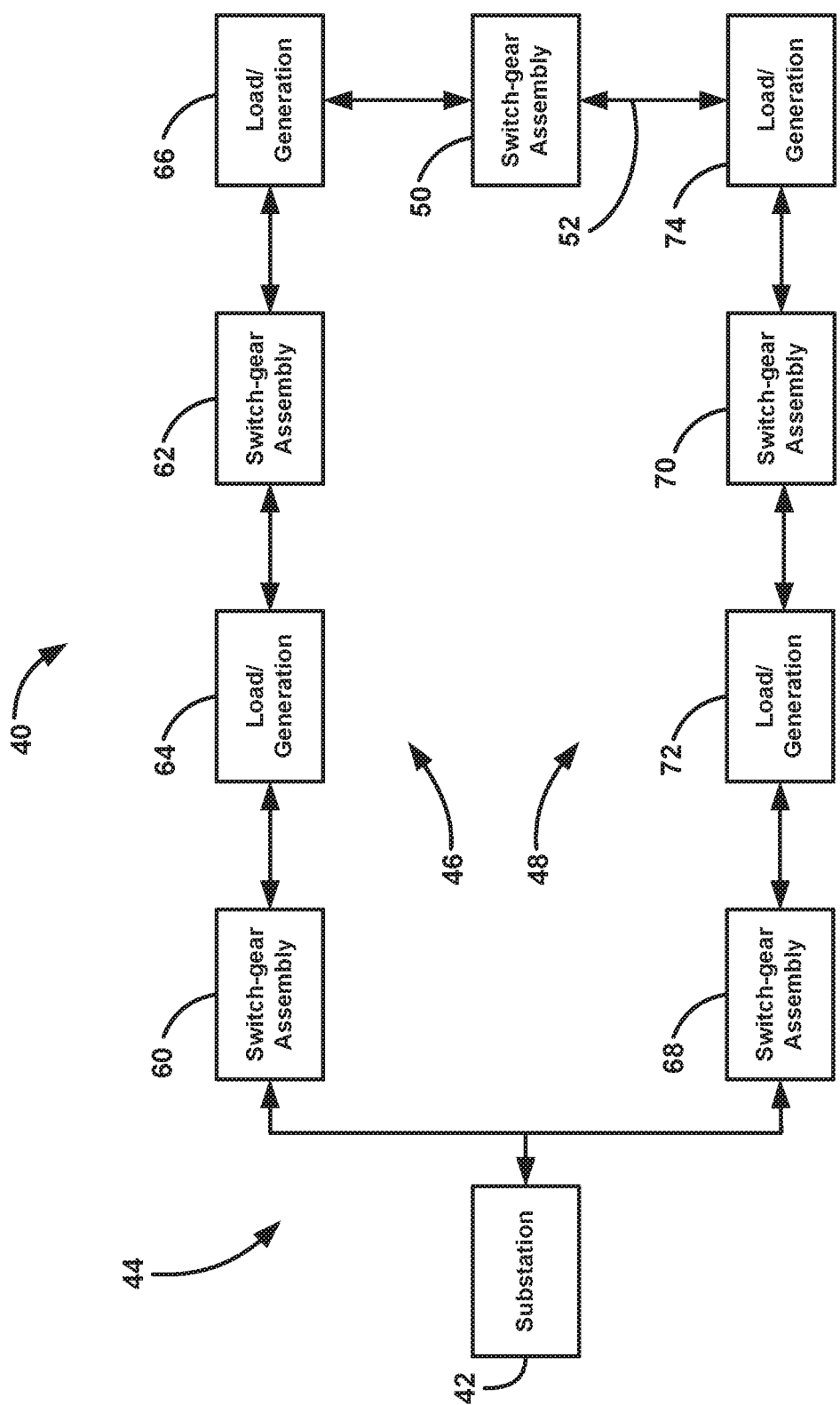
FIG. 4 is a block diagram of an electrical power distribution network including switch-gear assemblies and load/generation blocks.

The following discussion of exemplary embodiments directed to a system and method for providing frequency load shedding in an electrical power distribution network is merely exemplary in nature, and is in no way intended to limit the embodiments of the disclosure or applications or uses.

As will be discussed in detail below, a frequency load shedding scheme is disclosed for an electrical power distribution network that controls switch-gear at the outer edges of the network so that the number of loads that are removed from the network during a frequency event is limited. More specifically, switch-gear is distributed within a distribution network that supplies power to a group of loads. Each switch-gear detects a frequency event and which direction the power is flowing, i.e., is the group of loads providing power to the network. Thus, if the switch-gear determines that power is being provided to the network because the group of loads is generating more power than it is consuming, it will not remove the group of loads in response to the frequency event, but if the group of loads is drawing power from the network, then the switch-gear will open to remove the group of loads and help arrest the frequency occurrence. Further, the switch-gear are coordinated and calibrated in advance relative to each other so that those switch-gear that are servicing a fewer number of loads are opened before other switch-gear so that only a relatively small number of the loads are affected during the underfrequency event.

FIG. 1 is a general block diagram of a power distribution network 10 intended to represent any electrical power distribution system or network of any size and configuration that provides electrical power from any number or type of power plants (not shown) over any suitable distance on any type of transmission line (not shown) to electrical substations (not shown) to be distributed on feeder lines (not shown) to any suitable load (not shown).

The network 10 includes a grid 12 that is intended to represent all of the power distribution devices and systems in the network 10 that deliver power to the various loads in the network 10. Some of those components will be switch-gear, such as switch-gear 14 that represents one of the many switching devices, breakers, reclosers, interrupters, etc. that may be provided in the network 10 that controls power flow from a certain substation on the grid 12 to a load/generation block 16, which is intended to represent any suitable number or group of loads receiving power from the network 10, such as homes, businesses, manufacturing facilities, etc.

Some of the loads that may be drawing power at one point in time may be generating power, such as by, for example, an array of solar panels, wind turbines, storage cells, etc., at another point in time and be putting power on the grid 12, where the group of loads is consuming less power than it is producing. It would be unknown which particular location in the network 10 could be generating power at what particular point in time. As discussed above, any power generated on the network 10 helps reduce the magnitude and duration of an underfrequency event. It is noted that in this non-limiting illustration, power flows from the grid 12 through the switch-gear 14 to the load/generation block 16 when the load/generation block 16 acts as a load, and flows from the load/generation block 16 to the grid 12 when the load/generation block 16 acts as a generator. However, modern electrical systems are often configured such that power may be provided to the load/generation block 16 through a switch-gear (not shown) from the right of the load/generation block 16 if the power is coming from, for example, a different substation or feeder line in the grid 12.

The switch-gear 14 includes a controller 18 that controls whether the switch-gear is open or closed in order to connect or disconnect the load/generation block 16 to and from the grid 12 so as to prevent the load/generation block 16 from drawing power from the grid 12 or placing power on the grid 12. The controller 18 receives electrical measurement signals from the switch-gear 14 that allow the controller 18 to identify the direction of flow of current through the switch-gear 14 and to calculate the frequency of the AC power signal. The algorithms operating in the controller 18 will be coordinated with the algorithms operating in other switch-gear in the network 10 depending on their location so that as each controller 18 for each switch-gear 14 identifies a frequency event at the same time, those switch-gear that may be at a more remote location from the substation may be opened before other switch-gear upstream of the flow of power so that loads are removed from the grid 12 to stop the frequency event, but as few as possible load/generation locations will be affected. As load/generation locations are removed from the grid 12 eventually the frequency event will be removed.

FIG. 2 is a flow chart diagram 20 illustrating a simplified control algorithm operating in the controller 18 for determining whether to open the switch-gear 14 in response to an underfrequency event. At box 22, the algorithm identifies the frequency of the power signal traveling through the switch-gear 14, the direction of the power flow through the switch-gear 14 and a time delay value for the switch-gear 14 that is calibrated relative to the other switch-gear in the network 10. As the frequency of the power signal changes and is determined at each sample point, the algorithm may determine that the frequency of the AC signal has fallen below a predetermined minimum frequency set-point deadband specific for the switch-gear 14 and an underfrequency event is occurring. The algorithm then starts a timer, and after the time delay, the algorithm determines whether the frequency is still below the minimum frequency set-point at decision diamond 24 before taking any load shedding action. The switch-gear 14 that are farther downstream of the power flow in the grid 12, and thus have fewer load/generation blocks 16 after them, will have shorter time delay values so that they are the first ones to be opened in response to an underfrequency event. Thus, if the switch-gear 14 has a longer time delay value because it is farther upstream towards the substation in the grid 12, the frequency of the AC signal may go back up above the minimum frequency set-point because of loads being removed by other switch-gear before the time delay has passed.

If the frequency is not below the set-point at the decision diamond 24, then the algorithm returns to the box 22 to identify the frequency of the power signal at the next sample time. If the frequency of the AC signal is below the minimum frequency set-point at the decision diamond 24, the algorithm then determines whether the power flow through the switch-gear 14 is in the normal direction meaning that the load/generation block 16 is drawing power from the grid 12 and not putting power on the grid 12. If the power flow is not in the normal direction at the decision diamond 26 meaning power is being placed on the grid 12 by the load/generation block 16, then the switch-gear 14 is not opened because the load/generation block 16 is actually providing power generation of a reverse power flow. However, if the power flow is in the normal direction at the decision diamond 26 meaning the load/generation block 16 is drawing power from the grid 12, then the algorithm opens the switch-gear 14 at box 28 and returns to the box 22 to again determine the frequency, set the time delay value, and determine the direction of power flow. Once the frequency of the AC signal subsequently goes above the minimum frequency set-point, then the algorithm will reclose the switch-gear 14.

The methods discussed herein can also remove the load/generation block 16 from the grid 12 if there is an overfrequency event where the frequency of the power signal is above a certain value, which also could have detrimental effects on the stability of the grid 12. In this embodiment, the same process is performed where the fewest number of the load/generation blocks 16 are removed from the grid 12 so as to reduce the number of locations where power is disrupted. The algorithm operating in the controller 18 identifies the frequency of the AC signal, the power flow direction of the AC signal, and the time delay value for the particular switch-gear 14 at box 32 in the same manner as the box 22. As the frequency of the power signal changes and is determined at each sample point, the algorithm may determine that the frequency of the AC signal has risen above a predetermined maximum frequency set-point and an overfrequency event is occurring. The algorithm starts a timer, and after the time delay, the algorithm determines whether the frequency is still above the maximum frequency set-point at decision diamond 34 before taking any action, and if not, returns to the box 32. The switch-gear 14 that are farther downstream of the power flow in the grid 12, and thus have fewer load/generation blocks 16 after them, will have shorter time delay values so that they are the first ones to be opened in response to an overfrequency event.

If the frequency is above the set-point at the decision diamond 34, then the algorithm determines whether the power flow direction is in a reverse direction at decision diamond 36 meaning that the load/generation block 16 is putting power onto the grid 12. If the power flow is in the normal direction and not in the reverse direction at the decision diamond 36, the load/generation block 16 is drawing power like a normal load and is helping to lower the frequency of the power signal, and the algorithm returns to the box 32. However, if the load/generation block 16 is putting power on the grid 12 at the decision diamond 36 meaning the power flow is in the reverse direction, then the algorithm opens the switch-gear 14 at box 38 so that the load/generation block 16 is prevented from providing power onto the grid 12. Once the frequency of the AC signal subsequently goes below the maximum frequency set-point, then the algorithm will reclose the switch-gear 14.

FIG. 4 is schematic block diagram of an electrical power distribution network 40 illustrating an example of the scheme for removing loads discussed above during an underfreqeuncy event. In this non-limiting example, the network 40 includes an electrical loop 44 that receives a power signal from an electrical substation 42 and provides the power signal on an upper segment 46 of the loop 44 and a lower segment 48 of the loop 44 that travel in opposite directions. The upper segment 46 of the loop 44 and the lower segment 48 of the loop 44 are electrically separated by a switch-gear assembly 50 that is in a normally open position to prevent power flow between the upper segment 46 and the lower segment 48 through a connector segment 52. The upper segment 46 includes a number of series connected switch-gear assemblies 60 and 62 that each includes a switch-gear similar to the switch-gear 14 and a controller similar to the controller 18. The switch-gear assemblies 60 and 62 are separated by load/generation blocks 64 and 66 similar to the load/generation block 16. Likewise, the lower segment 48 includes a number of series connected switch-gear assemblies 68 and 70 separated by load/generation blocks 72 and 74. The load/generation blocks 66 and 74 would be electrically coupled together if the switch-gear assembly 50 was closed.

Part of the method can be illustrated by the following example. Consider that the load/generation block 66 has a load of 100 kW and a distributive power generation of 50 kW providing a net 50 kW load and the load/generation block 64 has a load of 100 kW and a distributive power generation of 125 kW providing a net −25 kW load, i.e., the combination of loads from the blocks 66 and 64 is consuming 25 kW in power from the network 40. Thus, the switch-gear assembly 62 sees the net 50 kW load from the block 66 and the switch-gear assembly 60 sees a net 25 kW load because of the combination of the net power values of the blocks 64 and 66. The load/generation block 74 has a load of 100 kW and a distributive power generation of 150 kW providing a net −50 kW load and the load/generation block 72 has a 100 kW load and a 50 KW distributive power generation providing a net 50 kW load. Thus, the switch-gear assembly 70 sees the net −50 kW load and the switch-gear assembly 68 sees a net 0 kW load because of the combination of the net power values of the combined load the blocks 72 and 74. This provides a combined upper and lower segment load on the substation 42 of net 25 kW composed of 400 kW in load and a distributive power generation of 375 kW.

In this example, the switch-gear assemblies 62 and 70 have the same time delay value, which is shorter than the time delay of the switch-gear assemblies 60 and 68, which are also the same. Since the switch-gear assembly 62 has a net 50 kW load and the switch-gear assembly 70 has a net −50 kW load, the switch-gear assembly 62 is opened and the switch-gear assembly 70 is not opened, which would remove the 100 kW load and the 50 kW distributive generation from the load/generation block 66. This will remove the net 50 kW load from the network 40, where the substation 42 would then see the reduction of 50 kW load to a net −25 kW load, and thus help support the underfrequency event. This scheme therefore reduces 50 kW in net load by only dropping 100 kW in loads at the block 66. This is more net load reduction and less gross load interruption in contrast to a substation based scheme that would have all the dropped loads and generation at the blocks 64, 66, 72 and 74 in which 400 kW load would be disconnected and only result in 25 kW in net load. Hence, only the load/generation block 66 is removed from the network 40 instead of all of the load/generation blocks 64, 66, 72 and 74 as would occur in the known load shedding schemes. If additional load is needed to be removed from the network 40 to overcome the underfrequency event, then the switch-gear assembly having the next shortest delay time and having a load would be opened, which is not the case in this example.

The normally-open switch-gear assembly 50 can be closed if a fault occurs and the circuit needs to be reconfigured. For example, if a fault occurs at or near the switch-gear assembly 62 and the switch-gear associated therewith is opened so that power is not delivered to the load/generation block 66, then the switch-gear assembly 50 can be closed so that power can be delivered to the load/generation block 66 from the lower segment 48. Therefore, the switch-gear assembly 50 would see the net 50 kW load of the block 66. In the same manner as discussed above, if the underfrequency event occurs in this configuration of the network 40, then the switch-gear assembly 50 would be the first to be opened to remove the load/generation block 66, which would again cause the substation 42 to see the net −25 kW load. In this scheme, the switch-gear must maintain topology information as to which direction is the grid 12. This topology direction is maintained in advance like the time-frequency set-points and changed from time-to-time as the circuit is reconfigured.

The foregoing discussion discloses and describes merely exemplary embodiments. One skilled in the art will readily recognize from such discussion and from the accompanying drawings and claims that various changes, modifications and variations can be made therein without departing from the spirit and scope of the disclosure as defined in the following claims.

What is claimed is:

1. A method for shedding load in response to an underfrequency event in an electrical power distribution network, wherein an AC power signal from a power source flows on at least one electrical line through a plurality of switch-gear assemblies to a plurality of groups of loads provided among and between the switch-gear assemblies, each group of loads including a plurality of individual loads that may combine to be drawing power from the network or providing power to the network at any particular point in time, the method comprising:

assigning a time delay value and a frequency set-point to each switch-gear assembly that are coordinated and calibrated relative to each other, where switch-gear assemblies that are farther downstream from the power source relative to the AC power signal flow will have shorter time delay values than other upstream switch-gear assemblies;

monitoring a frequency of the AC power signal flowing on the at least one electrical line at each switch-gear assembly;

determining that the underfrequency event is occurring if the frequency of the AC power signal falls below a predetermined minimum frequency; and opening a first one of the switch-gear assemblies having a shortest time delay value in response to the underfrequency event so as to prevent at least one of the groups of loads from drawing power from the network.

2. The method according to claim 1 further comprising determining a direction of the AC power signal flow through each switch-gear assembly and preventing the first one of the switch-gear assemblies from opening in response to the underfrequency event if the direction of the AC power signal flow through the first one of the switch-gear assemblies indicates that the at least one of the groups of loads is providing power to the network.

3. The method according to claim 2 further comprising opening a second one of the switch-gear assemblies having a next shortest time delay value in response to the underfrequency event so as to prevent at least one other of the groups of loads from drawing power from the network if the at least one of the groups of loads is providing power to the network.

4. The method according to claim 1 further comprising determining that an overfrequency event is occurring if the frequency of the AC power signal rises above a predetermined maximum frequency and opening the first one of the switch-gear assemblies in response to the overfrequency event so as to prevent the at least one of the groups of loads from providing power to the network.

5. The method according to claim 4 further comprising determining a direction of the AC power signal flow through each switch-gear assembly and preventing the first one of the switch-gear assemblies from opening in response to the overfrequency event if the direction of the AC power signal flow through the first one of the switch-gear assemblies indicates that the at least one of the groups of loads is drawing power from the network.

6. The method according to claim 1 wherein the individual loads may be providing power to the network from an electrical source selected from the group consisting of energy storage systems, solar arrays and wind turbines.

7. The method according to claim 1 wherein the at least one electrical line includes feeder lines and lateral lines, where the plurality of loads are coupled to the lateral lines, and where the switch-gear assemblies are provided on both the feeder lines and the lateral lines.

8. The method according to claim 1 wherein the power source is an electrical substation.

9. A method for shedding load in response to an underfrequency event in an electrical power distribution network, wherein an AC power signal from a substation flows on a feeder or lateral electrical line through a plurality of switch-gear assemblies to a plurality of groups of loads provided among and between the switch-gear assemblies, each group of loads including a plurality of individual loads that may combine to be drawing power from the network or providing power to the network at any particular point in time, the method comprising:
    assigning a time delay value and a frequency set-point to each switch-gear assembly that are coordinated and calibrated relative to each other, where switch-gear assemblies that are farther downstream from the power source relative to the AC power signal flow will have shorter time delay values than other upstream switch-gear assemblies;
    monitoring a frequency of the AC power signal flowing on the electrical line at each switch-gear assembly;
    determining a direction of the AC power signal flow through each switch-gear assembly;
    determining that the underfrequency event is occurring if the frequency of the AC power signal falls below a predetermined minimum frequency;
    opening a first one of the switch-gear assemblies having a shortest time delay value in response to the underfrequency event so as to prevent at least one of the groups of loads from drawing power from the network; and
    preventing the first one of the switch-gear assemblies from opening in response to the underfrequency event if the direction of the AC power signal flow through the first one of the switch-gear assemblies indicates that the at least one of the groups of loads is providing power to the network.

10. The method according to claim 9 further comprising opening a second one of the switch-gear assemblies having a next shortest time delay value in response to the underfrequency event so as to prevent at least one other of the groups of loads from drawing power from the network if the at least one of the groups of loads is providing power to the network.

11. The method according to claim 9 further comprising determining that an overfrequency event is occurring if the frequency of the AC power signal rises above a predetermined maximum frequency and opening the first one of the switch-gear assemblies in response to the overfrequency event so as to prevent the at least one of the groups of loads from providing power to the network.

12. The method according to claim 11 further comprising determining a direction of the AC power signal flow through each switch-gear assembly and preventing the first one of the switch-gear assemblies from opening in response to the overfrequency event if the direction of the AC power signal flow through the first one of the switch-gear assemblies indicates that the at least one of the groups of loads is drawing power from the network.

13. A method for shedding load in response to an underfrequency event in an electrical power distribution network, wherein an AC power signal from a power source flow on at least one electrical line through a plurality of switch-gear assemblies to a plurality of groups of loads provided among and between the switch-gear assemblies, the method comprising:
    assigning a time delay value to each switch-gear assembly that are calibrated relative to each other, where the switch-gear assemblies that are farther downstream from the power source relative to the AC power signal flow will have shorter time delay values than other upstream switch-gear assemblies;
    monitoring a frequency of the AC power signal flowing on the at least one electrical line at each switch-gear assembly;
    determining that the underfrequency event is occurring if the frequency of the AC power signal falls below a predetermined minimum frequency;
    opening a first one of the switch-gear assemblies at a remote location relative to the power source in response to the underfrequency event so as to remove at east one of the groups of loads from the network, and
    wherein opening a first one of the switch-gear assemblies includes opening a switch-gear assembly having a shortest time delay value.

14. The method according to claim 13 wherein each group of loads includes a plurality of individual loads that may combine to be drawing power from the network or providing power to the network at any particular point in time, and wherein the first one of the switch-gear assemblies is only opened if the at least one of the groups of loads is drawing power from the network.

15. The method according to claim 13 further comprising opening a second one of the switch-gear assemblies having a next shortest time delay value in response to the underfrequency event so as to prevent at least one other of the groups of loads from drawing power from the network if the at least one of the groups of loads is providing power to the network.

16. The method according to claim 13 further comprising determining that an overfrequency event is occurring if the frequency of the AC power signal rises above a predetermined maximum frequency and opening the first one of the switch-gear assemblies in response to the overfrequency event so as to prevent the at least one of the groups of loads from providing power to the network.

17. The method according to claim 16 further comprising determining a direction of the AC power signal flow through each switch-gear assembly and preventing the first one of the switch-gear assemblies from opening in response to the overfrequency event if the direction of the AC power signal flow through the first one of the switch-gear assemblies indicates that the at least one of the groups of loads is drawing power from the network.

18. The method according to claim 13 wherein the at least one electrical line includes feeder lines and lateral lines, where the plurality of loads are coupled to the lateral lines, and where the switch-gear assemblies are provided on both the feeder lines and the lateral lines.

19. The method according to claim 13 wherein the power source is an electrical substation.

\* \* \* \* \*